United States Patent [19]

Deppe et al.

[11] Patent Number: 5,089,860
[45] Date of Patent: Feb. 18, 1992

[54] QUANTUM WELL DEVICE WITH CONTROL OF SPONTANEOUS PHOTON EMISSION, AND METHOD OF MANUFACTURING SAME

[76] Inventors: Dennis G. Deppe, 6910 Hart La. #304, Austin, Tex. 78731; Thomas J. Rogers, 711 W. 32nd St. #138, Austin, Tex. 78705

[21] Appl. No.: 543,477

[22] Filed: Jun. 25, 1990

[51] Int. Cl.$^5$ .................. H01L 29/161; H01L 29/205; H01L 29/64
[52] U.S. Cl. ........................ 357/16; 357/17; 372/47
[58] Field of Search ...................... 357/16, 17; 372/47, 372/43, 49

[56] References Cited

PUBLICATIONS

Yablonovitch, Inhibited Spontaneous Emissions in Solid-State Physics and Electronics, Physical Review Letters, vol. 58, No. 20, 18 May 1987, pp. 2059–2062.
Yablonovitch, Inhibited and Enhanced Spontaneous Emission From Optically Thin AlGaAs/GaAs Double Heterostructures, Physical Review Letters, vol. 61, No. 22, 28 Nov. 1988, pp. 2546–2549.
Yokoyama, H., Enhanced Spontaneous Emission in Microcavity Optical Devices, 1990 Conference on Quantum Electronics, Anaheim, Calif., (May 21-25, 1990), IQEC'90, Wednesday Morning, pp. 136–217.
Jewell et al., Appl. Phys. Lett. 55 (5), Jul. 1989, pp. 424–426.
Lee et al., Electronics Letters, vol. 25, No. 20, Sep. 1989, pp. 1377–1378.
Gourley et al., Appl. Phys. Lett. 54 (13), Mar. 1989, pp. 1209–1211.
Geels et al., IEEE Photonics Technology Letters, vol. 2, No. 4, Apr. 1990, pp. 234–236.
Yoo et al., Appl. Phys. Lett. 56 (13), Mar. 1990, pp. 1198–1200.
Jewell et al., Appl. Phys. Lett. 53 (98), Aug. 1988, pp. 640–642.
Zinkiewicz et al., Appl. Phys. Lett. 54 (20), May 1989, pp. 1959–1961.
Koyama et al., Appl. Phys. Lett. 55 (3), Jul. 1989, pp. 221–222.
Gourley et al., Appl. Phys. Lett. 50 (18), May 1987, pp. 1225–1227.
Hulet et al., Physical Review Letters, vol. 55, No. 20, Nov. 1985, pp. 2137–2140.
Shah et al., Physical Review Letters, vol. 54, No. 18, May 1985, pp. 2045–2048.
Soda et al., Jpn. J. Appl. Phys., vol. 18, No. 12, 1979, pp. 2329–2330.
De Martini, Physics Letters A vol. 115, No. 9, May 1986, pp. 421–425.
Dutta, J. Appl. Phys. 53 (11), Nov. 1982, pp. 7211–7214.
Faist et al., J. Appl. Phys. 66 (3), Aug. 1989, pp. 1023–1032.
Heinzen et al., Physical Review Letters, vol. 58, No. 13, Mar. 1987, pp. 1320–1323.
Collins et al., Physical Review B vol. 30, No. 8, Oct. 1984, pp. 4501–4515.

(List continued on next page.)

*Primary Examiner*—Andrew J. James
*Assistant Examiner*—Sara W. Crane

[57] ABSTRACT

In the present invention, spontaneous photon emission intensity in a semiconductor quantum well is strongly influenced by a highly reflecting interface, with the quantum well to interface spacing being less than the optical emission wavelength of the quantum well. An enhancement/inhibition ratio on the order of 10 is possible according to the present invention using a single reflector, and enhancement/inhibition ratios on the order of 1000 are possible when two reflectors are used in the quantum well light-emitting diode structures. In addition, according to the present invention, the gain, directionality, and efficiency of a vertical cavity surface-emitting laser can also be greatly improved. A method of making a device according to the present invention is also presented.

14 Claims, 6 Drawing Sheets

PUBLICATIONS

Milonni, Physical Review A, vol. 25, No. 3, Mar. 1982, pp. 1315–1327.

Kleppner, Physical Review Letters, vol. 47, No. 4, Jul. 1981, pp. 233–236.

Stehle, Physical Review A, vol. 2, No. 1, Jul. 1970, pp. 102–106.

Purcell, Phys. Rev. 69, (1946), p. 681.

Loudon, *The Quantum Theory of Light*, (Oxford University Press, 1983), Chapters 2 and 4.

Verdeyen, *Laser Electronics*, (Prentice-Hall, 1981), Chapter 7.

Casey, Jr. et al., *Heterostructure Lasers: Part A*, (Academic Press, 1978), pp. 44–45.

Kressel et al., *Semiconductor Lasers and Heterojunction LEDs*, (Academic Press, 1977), Chapters 1 and 3.

Drexhage, *Progress in Optics*, edited by Wolf, (North-Holland, 1974), pp. 164–232.

Hass, *Applied Optics and Optical Engineering*, edited by Kingslake, (Academic Press 1965), p. 316.

QUANTUM WELL DEVICE WITH CONTROL OF SPONTANEOUS PHOTON EMISSION, AND METHOD OF MANUFACTURING SAME

BACKGROUND OF THE INVENTION

The invention relates to light-emitting quantum well semiconductor devices with improved spontaneous photon emission.

For light emitting diodes based on spontaneous emission, competing mechanisms for carrier recombination limit the light output efficiency. Non-radiative recombination of charge carriers injected at a p-n junction in a semiconducting device, for example, may occur in the semiconducting device at a faster rate than radiative recombination. In many cases, therefore, it would be desirable to increase the radiative recombination rate in the semiconductor device to compete more effectively with non-radiative mechanisms. Also, the spontaneous emission in a large optical cavity typically takes place in $4\pi$ steradians of space, that is in all directions, and again not all emitted light is collected. In some cases, therefore, it is desirable to cause the spontaneous radiation emitted in a light emitting diode to be emitted in a preferred direction.

Vertical-cavity surface-emitting lasers (VCSEL's) using a single, or only a few, quantum wells (QW's) are well known in the art. Such lasers have short cavities with highly reflecting end mirrors (reflectivities on the order of 0.998), in order to ensure lasing and to promote stimulated photon emission in the quantum well. The light emission in the VCSEL and the optical cavity occurs normal to the epitaxial crystal growth surface. The short gain length of these known VCSEL's place stringent requirements on the mirror reflectivities in order that the round trip gain-length product overcome cavity losses which arise due to mirror reflectivities having values less than unity, and also other parasitic cavity losses. The preferred method of realizing the highly reflecting mirrors makes use of pairs of alternating semiconductor materials of differing refractive index to form a distributed Bragg reflector (DBR). Because of typically small index ratios between semiconductor materials, a large number of pairs ($N_{pairs} > 23$) is required to achieve the desired reflectivity value for a single QW VCSEL of ~0.998. Semiconductor DBR mirrors are in many cases preferred for the QW VCSEL because they can be made electrically conducting. However, other mirror forms based on evaporated dielectrics and/or metals have also been used. The previously perceived strict requirement on mirror reflectivity for lasing has thus far limited device optical output efficiency due to the inability to achieve lasing when the reflectivity product of both end mirrors falls below a specified value, which for the single QW VCSEL is on the order of 0.997. Current QW VCSEL devices base the required mirror design in terms of mirror reflectivity on known values of the optical gain achievable from a semiconducting QW in an optical environment resembling an infinite cavity, and which has not been specifically designed to exert an influence over the QW spontaneous emission.

While many VCSEL's may currently benefit to some degree from a cavity enhanced gain, the enhancement has not previously been recognized nor taken advantage of in device design. Instead, current teaching assumes that QW gain in a VCSEL is unchanged over its value in a larger optical cavity, for example unchanged over that of more standard edge-emitting, semiconductor lasers. Thus, prior end mirror reflectivities for laser cavities are designed to achieve reflectivity values as governed by the equation:

$$R_1 R_2 \geq e^{-g_{max} \cdot L_z},$$

where $R_1$ and $R_2$ are the end mirror reflectivities, $g_{max}$ is the gain per unit length of the active region (preferably a single QW), and $L_z$ is the length of the active region. For a typical prior VCSEL design, $L_z$ is on the order of 80 Å, $g_{max}$ is assumed to be approximately $4 \times 10^3$ cm$^{-1}$, which results in the above-noted reflectivity product of greater than or equal to 0.997 in order to achieve lasing.

It would therefore be desirable to provide a light-emitting semiconductor device which exploits the advantages of the QW structure in diodes and in the VCSEL, while relaxing the requirement for highly reflecting mirrors, and thus improve device performance in terms of improved lasing efficiency, reduced electrical series resistance, or increased flexibility in device geometry.

SUMMARY OF THE INVENTION

The present invention avoids the above-noted drawbacks of prior light emitting diode and the VCSEL through the control of the spontaneous photon emission of the QW by placement of the QW in a specially designed optical cavity. The spontaneous photon emission is controlled by first, confining recombining electron and hole charge carriers to a region of crystal with a dimension much less than the wavelength of light to be emitted, such as in a quantum-well, and then strategically placing this light emission region in an optical cavity designed to modify the QW spontaneous light emission characteristics. The QW spontaneous emission characteristics are controlled through boundary conditions placed on the vacuum electromagnetic field causing spatially fixed nodes and anti-nodes to form in the vacuum field, and then placing the QW at a position in the cavity to overlap either an anti-node or a node of the vacuum field to either enhance or inhibit the QW spontaneous emission into preferred optical modes of the cavity. One case of the invention is when one of the optical reflectors forming the cavity is moved an infinite distance from the QW, while maintaining a close spacing between the other mirror and the QW. In this case the QW spontaneous emission will be controlled by the remaining closely spaced reflector. The invention relates to both light-emitting diodes based on spontaneous emission and also improved forms of semiconductor laser devices, in particular the vertical-cavity surface-emitting laser.

According to the present invention the spontaneous photon emission is controlled by a modified vacuum electromagnetic field, that is modified over a "free space" environment, by placing the QW in the cavity to control its spatial overlap with nodes or anti-nodes of the vacuum field. It is known that the spontaneous photon emission occurs due to interaction between the matter and the vacuum electromagnetic field. By placing strong boundary conditions on the vacuum field, the vacuum field can be made to exhibit nodes and anti-nodes where field fluctuations are either much smaller than those which occur in a "free space" environment, in the case of a node, or much larger, in the case of an anti-node. Also, using a structure which is known as a quantum well in the semiconductor, light emission can be made to originate from a spatial region of dimension much less than the emitted photon wavelength. It becomes possible, therefore, actually to place the QW at a node or an anti-node of the vacuum field for a desired wavelength to modify the QW- vacuum field overlap over that which occurs outside the strong optical cavity. In this way control can be exerted over the QW spontaneous emission to control the spontaneous emission rate, the directional dependence of the spontaneous emission, and the spontaneous emission lineshape.

Previous teachings of the art in the area of the VCSEL have relied solely on the design of an optical cavity and the placement of the QW in the optical cavity to control the QW interaction with stimulated or lasing emission. This design has necessarily required either longer gain paths, that is thicker bulk active region devices, or extremely high reflectivity values (>0.997) to achieve lasing. In the present invention use is made of an optical gain value enhanced by the control of the QW spontaneous emission. In this case, for a correctly placed QW in a correctly designed optical cavity, the QW can be made to exhibit a reduced spontaneous line width, as determined by the optical quality factor, or Q, of the cavity. In contradiction to the current teaching of the art, this allows a mirror reflectivity value to be decreased over that which is otherwise perceived necessary to achieve lasing. For example, current teaching requires that for a single QW VCSEL with a QW thickness of 80 Å, a maximum gain-length product $3 \times 10^{-3}$ based on QW gain data, requiring a mirror reflectivity product of >0.997. In the present invention, the cavity Q is specifically designed to control QW optical gain through the control of the spontaneous linewidth. This cavity Q is controlled through the choice of the end mirror reflectivity values and the effective cavity length. As a modification to current VCSEL designs, the present invention may be used simply to reduce one end mirror reflectivity value by, for example, reducing the number of pairs of an AlAs-GaAs distributed Bragg reflector, to improve the device operating efficiency, while maintaining the cavity enhanced QW gain at a value to still achieve lasing. This reduced value of mirror reflectivity, though, will have a value much lower than the previous teachings of the art.

Application of the present invention provides a VCSEL with greatly increased cavity gain, while at the same time reducing the stringent mirror reflectivity product requirement. For example, a VCSEL based on the present invention would have a cavity enhanced gain of 10-fold that of prior VCSEL's, while requiring a minimum mirror reflectivity product on the order of 0.969.

Other features and advantages of the present invention will become apparent to those of skill in the art with reference to following detailed description of the preferred embodiments.

DETAILED DESCRIPTION OF THE PREFERRED EMBODIMENTS

Figure 1:
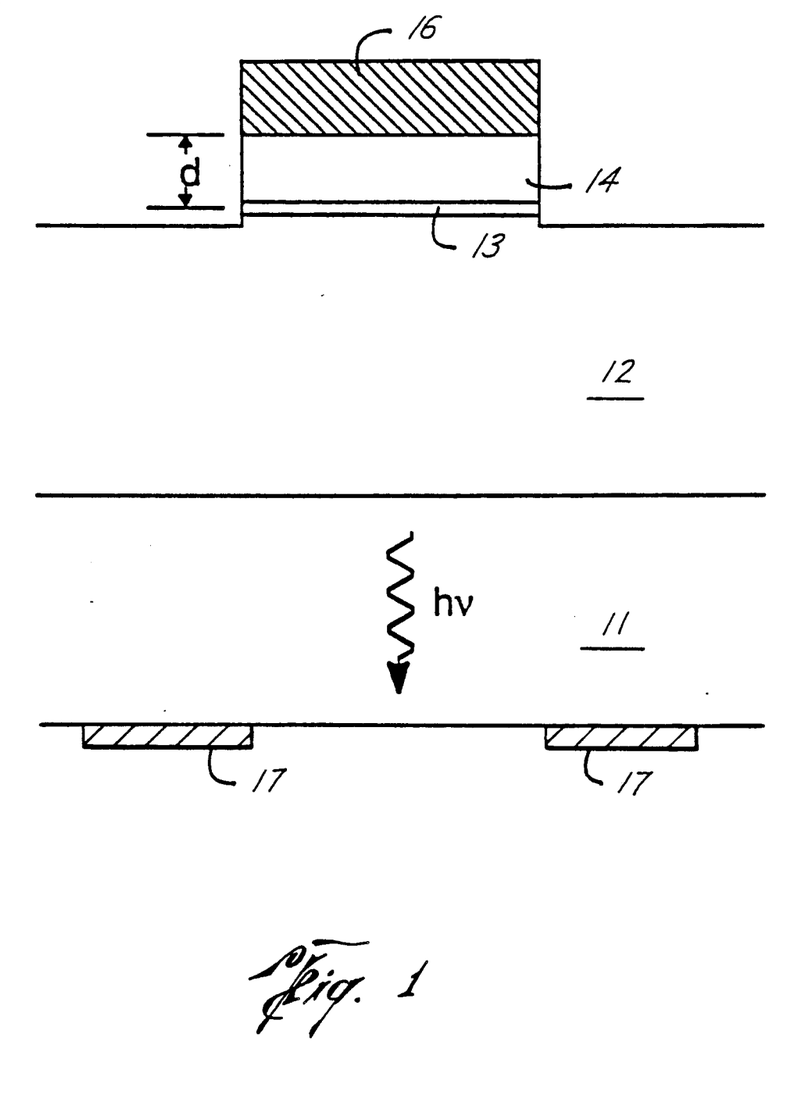
FIG. 1 is a quantum well-based p-n junction diode illustrating a first embodiment of the present invention.

Referring to FIG. 1, a quantum well-based p-n junction light-emitting diode, according to the present invention, is disclosed. The layers shown are grown preferably using molecular beam epitaxy, however other semiconductor processing techniques can also be used. In order to illustrate the present invention, four different wafers were investigated, each having the general structure illustrated in FIG. 1. The layers are grown on an n+ GaAs substrate 11, and include an n-type GaAs buffer layer 12 with thickness on the order of 0.5 micrometers, an undoped $In_{0.2}Ga_{0.8}As$ quantum well (QW) 13 having a thickness on the order of 125 Å, and upper p-type GaAs layer 14 in which the thickness d is varied for the four different wafers. To illustrate the present invention, thickness d of layer 14 is varied from 212 Å to 1160 Å. The upper 100 Å of p-type GaAs layer 14 is doped to provide a hole concentration of $> 10^{19}$ cm$^{-3}$ to facilitate forming a non-alloy electrical contact.

After the epitaxial crystal growth, p-n diodes are fabricated from the wafers by defining silver dots 16 of approximately 100 micrometers in diameter on p-type layer 14 using standard photolithography, thermal evaporation, and liftoff. Electrical contact 17, for example, of Indium metal, is used to connect with substrate 11. Other contact materials are also acceptable. The substrate sides of the wafers are polished using a Br-methanol etch to provide a smooth surface. A light etch is also used on the p-side of the wafer after contact formation in order to isolate individual devices.

Although specific examples of devices incorporating the present invention are disclosed herein, these examples are to be considered illustrative and not limiting of the invention. For example, the quantum well structure of the invention can be any Group III, Group V semiconductor combination. The QW preferably takes the form:

$$In_xGa_{1-x-y}Al_yAs_zP_{1-z},$$

where $0 \leq x$, y, $z \leq 1$, and $x + y = 1$. The p- and n-doped containing layers each preferably take the form:

$$In_{x'}Ga_{1-x'-y'}Al_{y'}As_{z'}P_{1-z'},$$

where $0 \leq x'$, y', $z' \leq 1$, and $x' + y' = 1$. Also, in general, the light emission wavelengths are preferably in the range of 0.55-1.65 μm.

In order to characterize the devices of FIG. 1 having different thicknesses d, light was collected from the substrate side normal to the crystal surface as shown in FIG. 1, and light output was measured either for integrated intensity or for spectral content. In either case, a silicon photodiode was used for light detection.

Figure 2A:
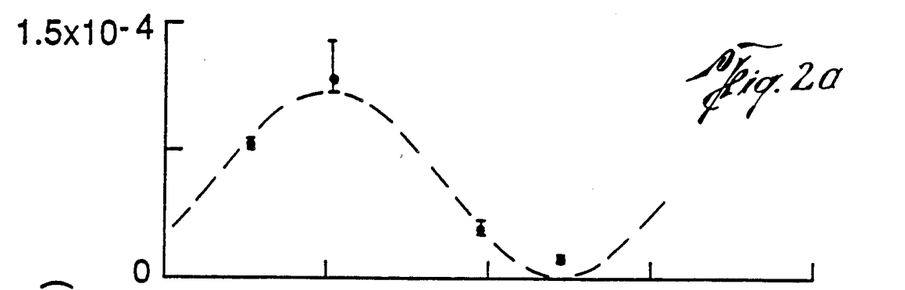
FIGS. 2a, 2b, 2c and 3 are graphs of the light-emitting characteristics of the device of FIG. 1 as functions of certain controllable parameters.
Figure 2B:
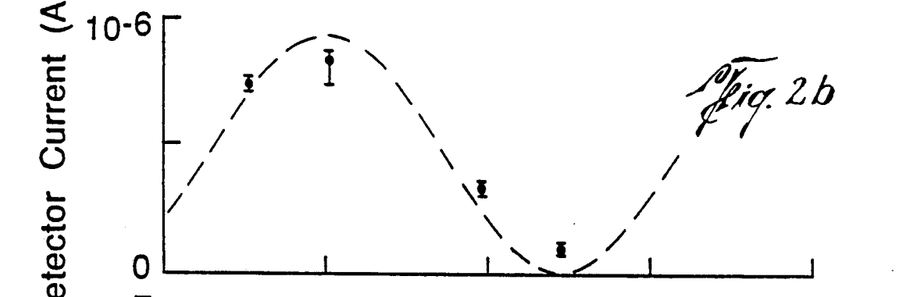
Figure 2C:
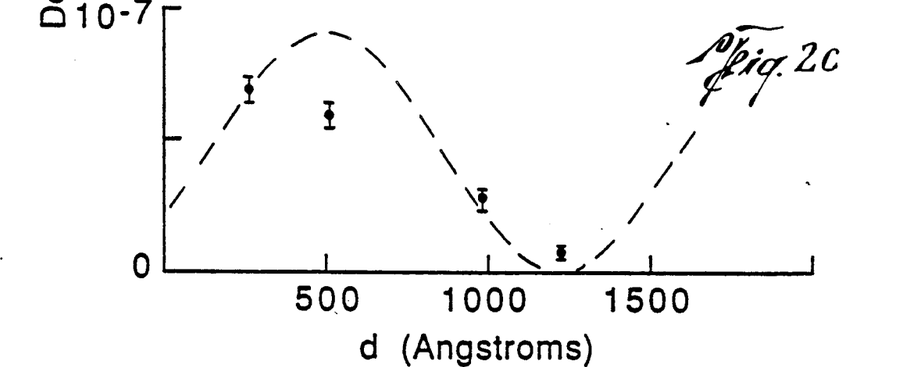

Referring to FIGS. 2a-c, shown are graphs of the integrated intensity of light as a function of distance, d, for the device of FIG. 1, and for three different current injection levels. FIG. 2a is for a current injection level of 25 A/cm$^2$, FIG. 2b for a level of 127 A/cm$^2$, and FIG. 2c for 509 A/cm$^2$. As illustrated in the graphs of FIG. 2, the integrated emission intensity for a given current density is a strong function of the Ag-GaAs mirror to quantum well spacing, d, peaking for higher current densities at d=508 Å while reaching a minimum for a value of d=1222 Å. In the device of FIG. 1, considering the phase shift from the Ag-GaAs interface for an electromagnetic wave with a wavelength of approximately 1 micrometer, the distance of 508 Å corresponds to an effective spacing of $\lambda/4$ between quantum well 13 and the Ag-GaAs mirror, while 1222 Å corresponds to $\lambda/2$.

Figure 3:
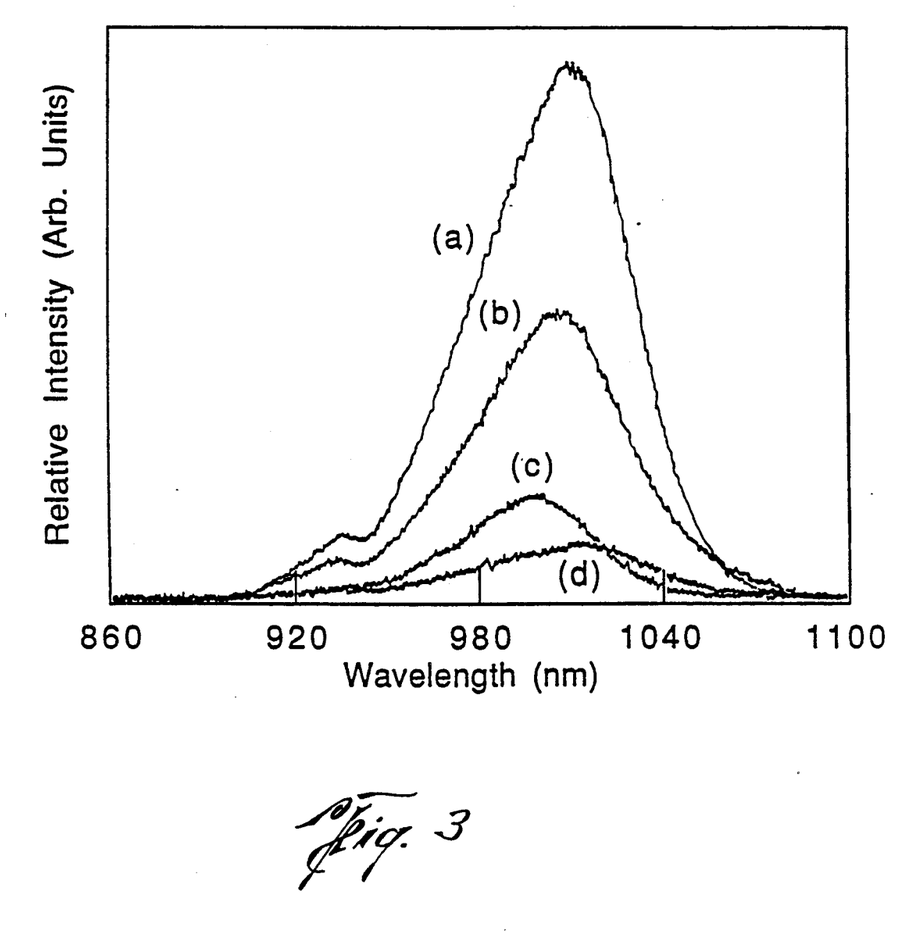

FIG. 3 is a graph showing spectral data measured from the device of FIG. 1 for a current density of 509 A/cm$^2$ at 300 degrees K. In FIG. 3, curves a, b, c and d correspond, respectively, to dimension d in FIG. 1 equal to 508, 274, 988 and 1222 Å.

In the case of the InGaAs-GaAs quantum well structures presented, the electron-hole pairs are confined spatially to a region with a dimension less than the photon wavelength. In the device of FIG. 1, the quantum well thickness is on the order of 125 Å as compared to a photon wavelength of on the order of 0.28 micrometers. Thus, according to the present invention, the quantum well is placed relative to the highly reflective Ag-GaAs interface in such a manner that the quantum well overlaps either a node (for the case of d=1222 Å) or an anti-node (for the case of d=508 Å) of the vacuum electromagentic field. In calculating d, assumed are a free-space photon wavelength of 1 micrometer, a refractive index value of n=3.54 for GaAs, and a complex refractive index for Ag of 0.13+i6.9. According to the present invention, the Ag-GaAs to quantum well spacing, d, must be kept small to avoid significant overlap with anti-nodes (or nodes) of photon modes in which the wavelength is near but not equal to 1 micrometer.

The photon emission intensity is a function of electric dipole (electron-hole pair) to mirror spacing according to the equation:

$$I = 1 + \rho^2 + 2\rho \cos[(4\pi nd/\lambda) - \delta], \quad (1)$$

Where I is the photon emission intensity, $\rho$ is the magnitude of the electric field reflectivity coefficient, n is the dielectric refractive index, d is the dipole to mirror spacing, and $\delta$ is the phase shift for the electric field reflectivity at the reflector interface. The dashed curves drawn in FIGS. 2a-c illustrate the expected dependence of emission intensity versus mirror to quantum well spacing using equation (1). Equation (1) is expected to overestimate the enhancement/inhibition ratio for the case of the semiconductor quantum well of FIG. 1, due both to the finite well thickness and also the spread of the spontaneous emission line width.

The ability to control the dipole interaction strength for electron-hole pairs in semiconductor quantum wells, in accordance with the present invention, has significant device implications. For example, the spontaneous lifetime takes on a directional dependence, providing, therefore, control over the light emission patterns from light emitting diodes, and more efficient light output coupling into preferred directions. Also, since the spontaneous lifetime can be shortened over the case without the closely spaced reflector, radiative recombination can be made to compete more effectively with non-radiative recombination processes. In addition, as mentioned in more detail below, in semiconductor lasers, since stimulated emission is closely connected to the spontaneous emission process, enhanced emission into the resonant modes of a Fabri-Perot cavity is possible, resulting in a larger and directionally dependent gain coefficient.

Figure 4:
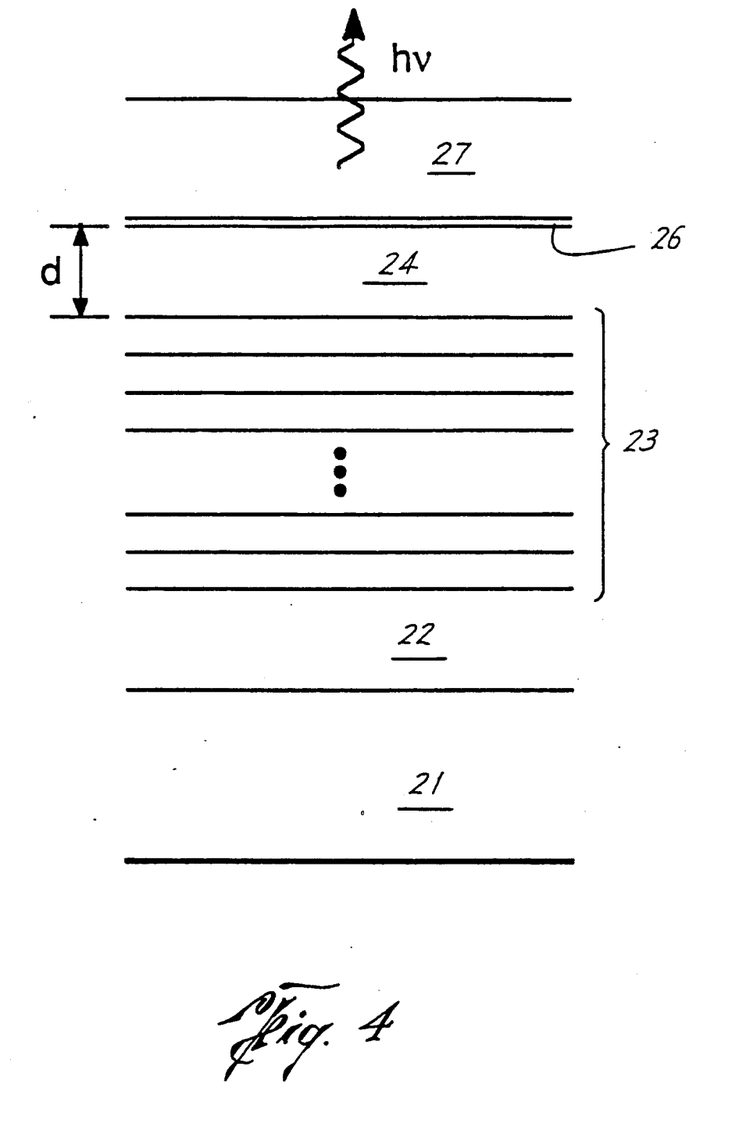
FIG. 4 is a quantum-well based p-n junction light-emitting diode incorporating a distributed Bragg reflector, according to a second embodiment of the present invention.

Referring now to FIG. 4, a second embodiment of the present invention is disclosed using an InGaAs-GaAs quantum well closely spaced to an AlAs GaAs distributed Bragg reflector (DBR). In comparison to the device of FIG. 1, using an Ag reflector system an enhancement/inhibition ratio of several orders of magnitude can be realized using the device of FIG. 4.

Once again, MBE is used to construct the device of FIG. 4, however, other semiconductor processing techniques can be used as well. In the device of FIG. 4, an n-doped GaAs buffer layer 22 is formed on n+GaAs substrate 21. The thickness of buffer layer 22 is preferably on the order of 0.5 micrometers. On buffer layer 22 is formed a highly reflecting distributed Bragg reflector (DBR) including 19.5 pairs of AlAs-GaAs alternating layers. On DBR 23 is formed an n-doped GaAs phase shift layer 24, having a thickness, d, which is varied as described below to illustrate the characteristics of the invention. Next, quantum well 26 is formed of a single undoped crystal of $In_{0.2}Ga_{0.8}As$, with a preferred thickness on the order of 125 Å. Next p-doped GaAs layer 27 is formed, having a preferred thickness of on the order 0.57 micrometers. The spacing, d, between quantum well 26 and the first interface of DBR 23 was varied for three different wafers, for a spacing, d, equal to $\lambda/4$, $\lambda/2$ and $3\lambda/4$, where $\lambda$ is the optical emission wavelength of the quantum well in the GaAs crystal. A fourth crystal, with a structure similar to that shown in FIG. 4, but without the full AlAs-GaAs DBR, was also created and measured. In this fourth crystal the DBR was replaced with a single AlAs layer of $\lambda/4$ thickness spaced $\lambda/2$ away from quantum well 26.

These four wafers were characterized using photoluminescence and reflectivity measurements. In addition, the wafer having spacing, d, equal to $\lambda/4$ was characterized in terms of the spontaneous photon emission spectrum by measuring electroluminescence.

Figure 5:
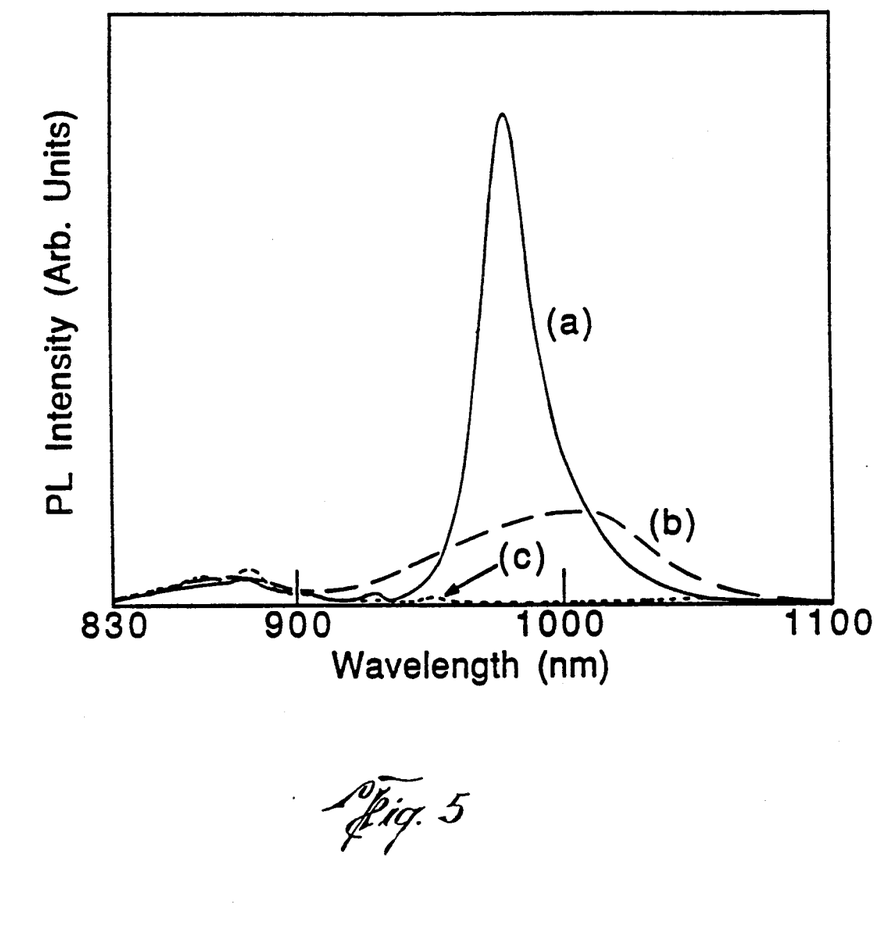
FIGS. 5-7 are graphs illustrating the light-emitting characteristics of the device of FIG. 4 as functions of various controllable parameters.

Referring to FIG. 5, shown are room temperature (300° K.) photoluminescence measurements on three of the four abovementioned wafers of FIG. 4. Curve (a) is the spontaneous photon emission spectrum for spacing $d=\lambda/2$, curve (b) for the wafer without a DBR, and curve (c) is the spontaneous photon emission spectrum for the wafer with $d=\lambda/4$. The wafer having $d=3\lambda/4$ is not shown in FIG. 5, but was found to have a spectrum similar to the spectrum measured for the wafer having $d=\lambda/4$ (curve (c)). For each wafer, to produce the graphs of FIG. 5, photoluminescence was collected normal to the surface of each wafer. As is apparent in FIG. 5, both the spontaneous photon emission photoluminescence and spectral characteristics are strong functions of DBR existence and spacing. Comparing curve (a) and (c) of FIG. 5, spacing $d=\lambda/2$ strongly enhances the spontaneous photon emission from the quantum well, while spacing $d=\lambda/4$ strongly suppresses the spontaneous photon emission. The enhancement/inhibition ratio from the quantum well of the device of FIG. 4 for $d=\lambda/2$ and $d=\lambda/4$ is greater than 1000. Also, in comparing the spectra of curve (a) and curve (b) of FIG. 5, it can be seen that the presence of the DBR greatly enhances and narrows the spontaneous photon emission spectrum.

This spectral narrowing is believed to result from the cavity effect created between the DBR, which has an estimated reflectivity on the order of 0.99, and the upper GaAs-air interface, having a reflectivity on the order of 0.3. Curve (a) of FIG. 5 also illustrates that the quantum well spontaneously radiates only into the allowed cavity mode, with the spontaneous line width being determined by cavity Q (the quality factor of the cavity).

The equation for cavity Q is typically given by:

$$Q = \nu/\Delta\nu = 2\pi(L_c/\lambda)[-\ln(R_1 R_2)^{\frac{1}{2}}]^{-1}, \quad (2)$$

where $\nu$ is the cavity resonant frequency, $\Delta\nu$ is the line width, $L_c$ is the cavity length, and $R_1$ and $R_2$ are the reflectivities of the mirrors defining the cavity. In the device of FIG. 4, because the front mirror reflectivity (the GaAs-air interface), is small ($R_2$ on the order of 0.3), the cavity Q is relatively insensitive to the rear mirror reflectivity value. Therefore, if $R_1 = 1$ (the DBR reflectivity), $R_2 = 0.3$, and $L_c$ is on the order of 2.5 $\lambda$, equation (2) produces a Q of approximately 26. This would correspond to a line width $\Delta\nu$ of approximately $1.2 \times 10^{13}$ sec$^{-1}$ for the center frequency shown in FIG. 5 of approximately $3.1 \times 10^{14}$ sec$^{-1}$. Referring to curve (a) of FIG. 5, the actual line width is seen to be on the order of $6.3 \times 10^{12}$ sec$^{-1}$. This discrepancy is believed to be a result of the extended length of the DBR. The Q can also be considered as a measure of the average photon lifetime in the optical cavity for a particular frequency. In the case of the device of FIG. 4, the length of the DBR increases the round trip time for the photon in the cavity, while still providing a reflectivity, $R_1$, of approximately 1. Using equation (2) the effective cavity length due to both of the GaAs containment regions, and the DBR can be calculated from the measured Q, using curve (a) of FIG. 5, which yields a value of Q on the order of 49. This measured Q suggests that the effective cavity length of the device of FIG. 4 is actually on the order of 4.7$\lambda$.

As mentioned above, the spontaneous photon emission from the QW is constrained to radiate into the optical modes of the cavity in which the QW is placed. In FIG. 1 discussed above, the QW was closely spaced to a highly reflecting GaAs-Ag interface. For the AlAs-GaAs DBR-QW device of FIG. 4, the mirror effect on spontaneous photon emission is considerably more pronounced.

Figure 6:
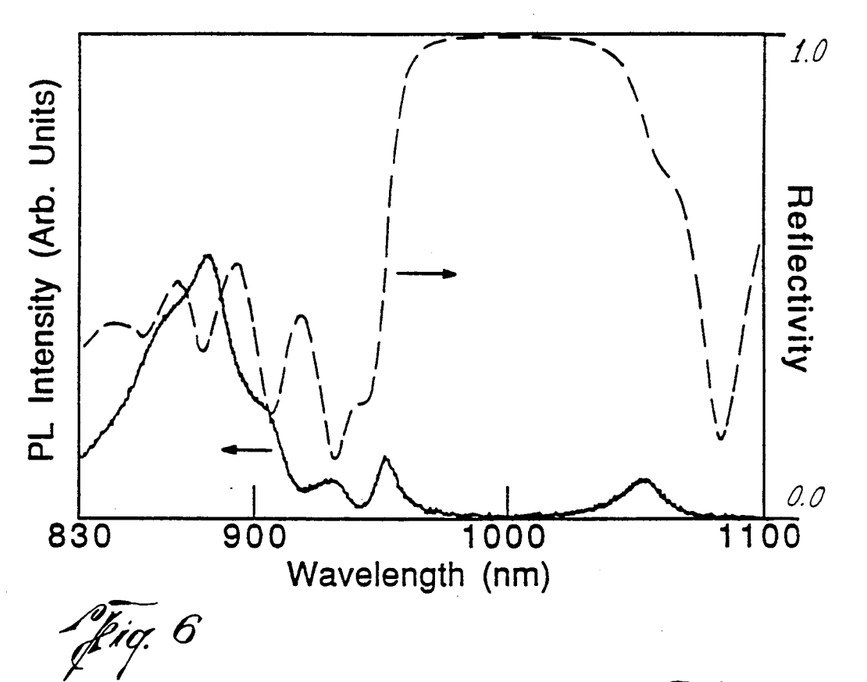

FIG. 6 is graphs showing the magnitude of the photoluminescence of the spontaneous photon emission spectrum (solid curve), along with the measured reflectivity (broken curve), for the device of FIG. 4 at room temperature (300° K.) and with a QW-DBR spacing, d of $\lambda/4$. As can be seen from FIG. 6, for wavelengths at which the DBR has a reflectivity very close to 1 (where the emitted wavelength is on the order of 1 micrometer), the spontaneous photon emission is most strongly suppressed, while at the edges of the DBR bandwidth where reflectivity drops, the QW spontaneous photon emission intensity increases. In addition, at slightly shorter wavelengths on the order of 0.88 micrometers, the spontaneous photon emission intensity curve of FIG. 6 exhibits peaks which coincide with the cavity transmission peaks, even with the relatively small GaAs-air interface reflectivity on the order of 0.3.

Figure 7:
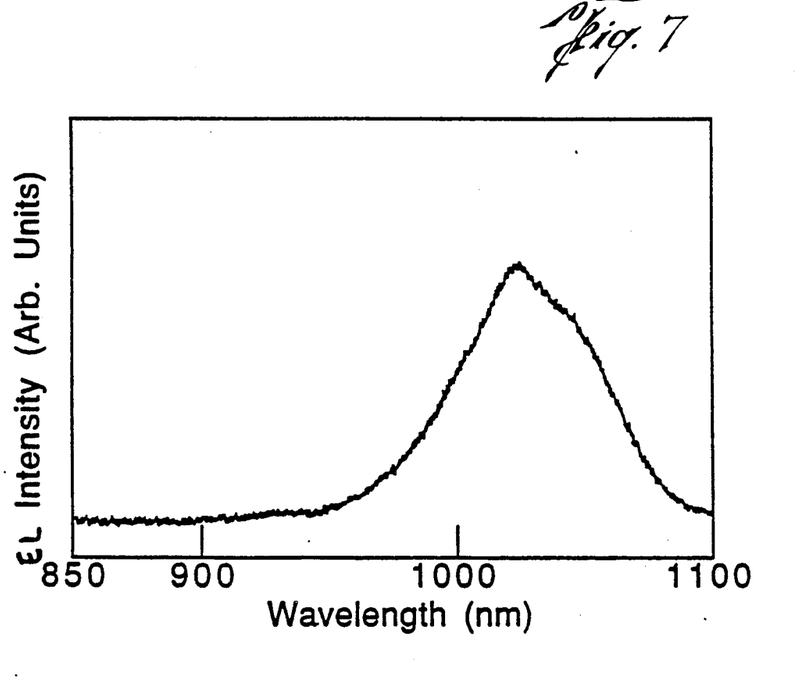

Since the spontaneous photon emission of the QW of FIG. 4 is weak normal to the crystal surface for the wafer with the QW to DBR spacing of $d = \lambda/4$, electroluminescence was also measured for the device of FIG. 4. Referring to FIG. 7, shown is a graph illustrating the lateral spontaneous photon emission of the device of FIG. 4, measured from the edge of the wafer. In this lateral direction, the QW is found to emit with the spontaneous spectrum peaked at a wavelength of approximately 1.02 micrometers, close to the wavelength expected for the InGaAs QW without the influence of a mirror.

The present invention can also be applied to improve the performance of a vertical cavity surface emitting laser (VCSEL). In particular, the present invention allows use of a lower mirror reflectivity product in a VCSEL, while still maintaining lasing. In the present invention, the new quantum well gain is given by the formula:

$$g_{cav,max} = \Delta\nu_o(Q/\nu)g_{max}, \quad (3)$$

where $g_{cav,max}$ is the cavity enhanced gain, $\Delta\nu_o$ is the spontaneous bandwidth of the QW in an infinite cavity, Q is the quality factor of the cavity calculated according to equation (2) above, $\nu$ is the cavity resonant frequency, and $g_{max}$ is the cavity gain without use of the present invention. According to the present invention, placement of the quantum well in the optical cavity of the VCSEL must be maintained at an anti-node of the vacuum field. An easily achievable Q, according to the invention, is on the order of 300, which corresponds to a cavity enhanced gain, $g_{cav,max}$, on the order of $10 \times g_{max}$ at room temperature. Also, according to the present invention, care must be taken in the design of the optical cavities so that its resonant frequency, $\nu$ strongly overlaps the spontaneous spectrum of the quantum well in an infinite cavity.

Due to the enhanced cavity gain, the mirror reflectivity product of a VCSEL incorporating the present invention can be lower than previously considered, for example in the range of $0.969 \leq R_1 R_2 \leq 0.997$. This reduced reflectivity product greatly increases the efficiency of the VCSEL of the present invention.

In addition, by constructing a VCSEL with mirrors placed according to the present invention, one end mirror can have a reflectivity different from the other end mirror, resulting in a highly directional semiconductor laser, thereby further increasing device efficiency. For example, the first end mirror could have a reflectivity on the order of 0.995, whereas the second end mirror could have a reflectivity on the order of 0.973. Other values for reflectivities of the end mirrors are also acceptable without departing from the scope of the invention.

The present invention has been described with reference to illustrative preferred embodiments. However, it will be appreciated by those of skill in the art that changes, additions, and deletions can be made to those preferred embodiments, without departing from the spirit and scope of the present invention.

What is claimed is:

1. A light-emitting semiconductor device with improved spontaneous photon emission, comprising:
   a quantum well capable of emitting light of an optical emission wavelength, a thickness of said quantum well being much less than said optical wavelength; and
   a single reflector spaced from said quantum well a distance substantially equal to one-fourth said optical emission wavelength, said reflector having means for causing phase shift of said emission wavelength, to control spontaneous photon emission of said quantum well.

2. A light-emitting semiconductor device with improved spontaneous photon emission, comprising:
  a quantum well capable of emitting light of an optical emission wavelength, a thickness of said quantum well being much less than said optical wavelength;
  a first reflector spaced from said quantum well a distance substantially equal to said optical emission wavelength;
  a second reflector spaced from said quantum well a distance substantially equal to one-fourth said optical emission wavelength, whereby said quantum well is intermediate said first and second reflectors, and wherein a reflectivity of said first reflector is less than a reflectivity of said second reflector; and
  said second reflector having means for causing phase shift of said emission wavelength to control spontaneous photon emission of said quantum well.

3. The device of claim 2, wherein said reflectivity of said first reflector is much less than said reflectivity of said second reflector.

4. The device of claim 2, wherein said quantum well is placed at an anti-node of said electromagnetic vacuum field within said semiconductor device.

5. The device of claim 2, further comprising:
  a material of a first conductivity intermediate said first reflector and said quantum well; and
  a material of a second conductivity intermediate said second reflector and said quantum well.

6. The device of claim 1, wherein the quantum well is at an anti-node of said electromagnet vacuum field.

7. The device of claim 1, wherein the quantum well is at a node of said electromagnetic vacuum field.

8. The device of claim 1, further comprising:
  a material of first conductivity adjacent a first side of said quantum well intermediate said reflector and said quantum well; and
  a material of a second conductivity adjacent a second side of said quantum well.

9. The device of claim 2, wherein said quantum well is at a node of an electromagnetic vacuum field within said semiconductor device.

10. The device of claim 2, wherein said quantum well is at an anti-node of an electromagnetic vacuum field within said semiconductor device.

11. The device of claim 2, said second reflector comprising materials of alternating values of refractive index.

12. A light-emitting semiconductor device with improved spontaneous photon emission, comprising:
  a quantum well capable of emitting light of an optical emission wavelength, a thickness of said quantum well being much less than said optical wavelength; and
  a single reflector having a reflectivity of at most 0.998 and spaced from said quantum well a distance substantially equal to one-fourth said optical emission wavelength;
  said quantum well being placed at an anti-node or node of an electromagnetic vacuum field within said semiconductor device.

13. The device of claim 12, further comprising:
  a material of first conductivity adjacent a first side of said quantum well intermediate said reflector and said quantum well; and
  a material of a second conductivity adjacent a second side of said quantum well.

14. A light-emitting semiconductor device with improved spontaneous photon emission, comprising:
  a quantum well capable of emitting light of an optical emission wavelength, a thickness of said quantum well being much less than said optical wavelength;
  a first reflecting interface spaced from said quantum well a distance substantially equal to said optical emission wavelength;
  a second reflecting interface including a plurality of material layers of alternating values of refractive index, said plurality of layers having one layer arranged nearest said quantum well and spaced from said quantum well a distance substantially equal to one-fourth said optical emission wavelength, whereby said quantum well is intermediate said first and second reflecting interfaces, and wherein a reflectivity of said first reflecting interface is less than a reflectivity of said second reflecting interface; and
  said quantum well being at an anti-node or node of an electromagnetic vacuum field within said semiconductor device.

* * * * *

UNITED STATES PATENT AND TRADEMARK OFFICE
CERTIFICATE OF CORRECTION

PATENT NO. : 5,089,860

DATED : February 18, 1992

INVENTOR(S) : Deppe et al.

It is certified that error appears in the above-identified patent and that said Letters Patent is hereby corrected as shown below:

Claim 6, column 9, line 36, please delete "electromagnet" and substitute therefor --electromagnetic--.

Signed and Sealed this

Fourth Day of May, 1993

Attest:

MICHAEL K. KIRK

Attesting Officer

Acting Commissioner of Patents and Trademarks